United States Patent
Oh et al.

(10) Patent No.: US 9,846,359 B1
(45) Date of Patent: Dec. 19, 2017

(54) DIFFRACTION-BASED OVERLAY MARKS AND METHODS OF OVERLAY MEASUREMENT

(71) Applicant: Samsung Electronics Co., Ltd., Suwon-si, Gyeonggi-do (KR)

(72) Inventors: Seung Hwa Oh, Hwaseong-si (KR); Seung Yoon Lee, Seoul (KR); Jeong Jin Lee, Hwaseong-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 15/392,297

(22) Filed: Dec. 28, 2016

(30) Foreign Application Priority Data

Jun. 14, 2016 (KR) .................. 10-2016-0073919

(51) Int. Cl.

| | |
|---|---|
| H01L 21/00 | (2006.01) |
| H01L 21/66 | (2006.01) |
| G01R 31/26 | (2014.01) |
| G03F 1/44 | (2012.01) |
| G01B 11/00 | (2006.01) |
| H01L 21/027 | (2006.01) |
| G03F 1/36 | (2012.01) |
| G03F 1/42 | (2012.01) |

(52) U.S. Cl.
CPC .............. *G03F 1/44* (2013.01); *G01B 11/005* (2013.01); *G03F 1/36* (2013.01); *G03F 1/42* (2013.01); *H01L 21/0273* (2013.01); *H01L 22/20* (2013.01)

(58) Field of Classification Search
CPC ....... H01L 21/0273; H01L 21/20; G03F 1/44; G01B 11/005

USPC .................................................. 438/5, 7, 16
See application file for complete search history.

(56) References Cited

U.S. PATENT DOCUMENTS

| | | | |
|---|---|---|---|
| 4,870,289 A * | 9/1989 | Sato ...................... | G03F 9/7049 250/548 |
| 6,855,464 B2 | 2/2005 | Niu et al. | |
| 7,564,555 B2 | 7/2009 | Den Boef et al. | |

(Continued)

FOREIGN PATENT DOCUMENTS

| | | |
|---|---|---|
| JP | 2010/032377 A | 2/2010 |
| KR | 2009/0098207 A | 9/2009 |

(Continued)

*Primary Examiner* — David S Blum
(74) *Attorney, Agent, or Firm* — Harness, Dickey & Pierce, PLC

(57) ABSTRACT

A method may include forming a first grating and a second grating, disposed in a region of vertical overlap of the first and second gratings on different levels, respectively, having substantially the same pitch, and inclined with respect to each other, such that a bias value between the first and second gratings is changed along a length direction of the first and second gratings, using a lithography process. A method may include emitting a beam to the first and second gratings; and obtaining trend information associated with a diffracted beam from an image pattern of a beam from the first and second gratings, using the emitted beam, in which the trend information may concern changes in the intensity of the diffracted beam according to the bias value. An overlay error in at least one grating may be determined based on the trend information and an intensity of a diffracted beam.

20 Claims, 19 Drawing Sheets

(56) References Cited

U.S. PATENT DOCUMENTS

| | | |
|---|---|---|
| 7,582,395 B2 | 9/2009 | Chiu et al. |
| 8,084,872 B2 | 12/2011 | Yang |
| 8,411,287 B2 | 4/2013 | Smilde et al. |
| 2005/0195398 A1 | 9/2005 | Adel et al. |
| 2010/0091284 A1 | 4/2010 | Mieher et al. |
| 2013/0155406 A1 | 6/2013 | Den Boef |
| 2014/0192338 A1 | 7/2014 | Den Boef |
| 2015/0346605 A1 | 12/2015 | Den Boef et al. |
| 2016/0025484 A1 | 1/2016 | Kim et al. |

FOREIGN PATENT DOCUMENTS

| | | |
|---|---|---|
| KR | 2014/0130222 A | 11/2014 |
| WO | WO-2009/078708 A1 | 6/2009 |

\* cited by examiner

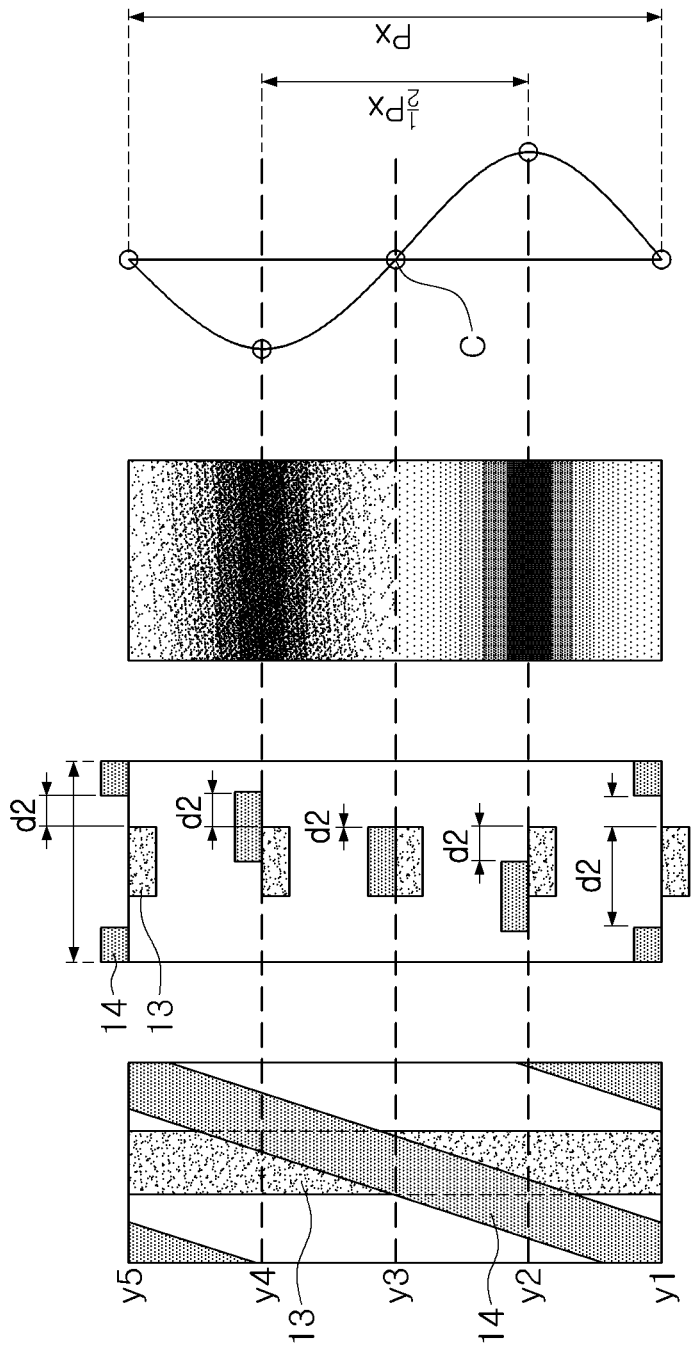

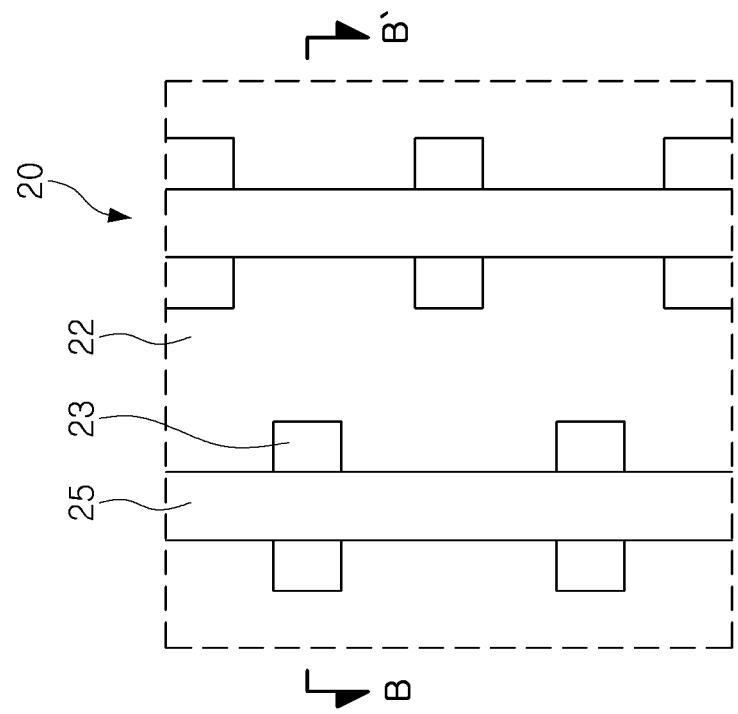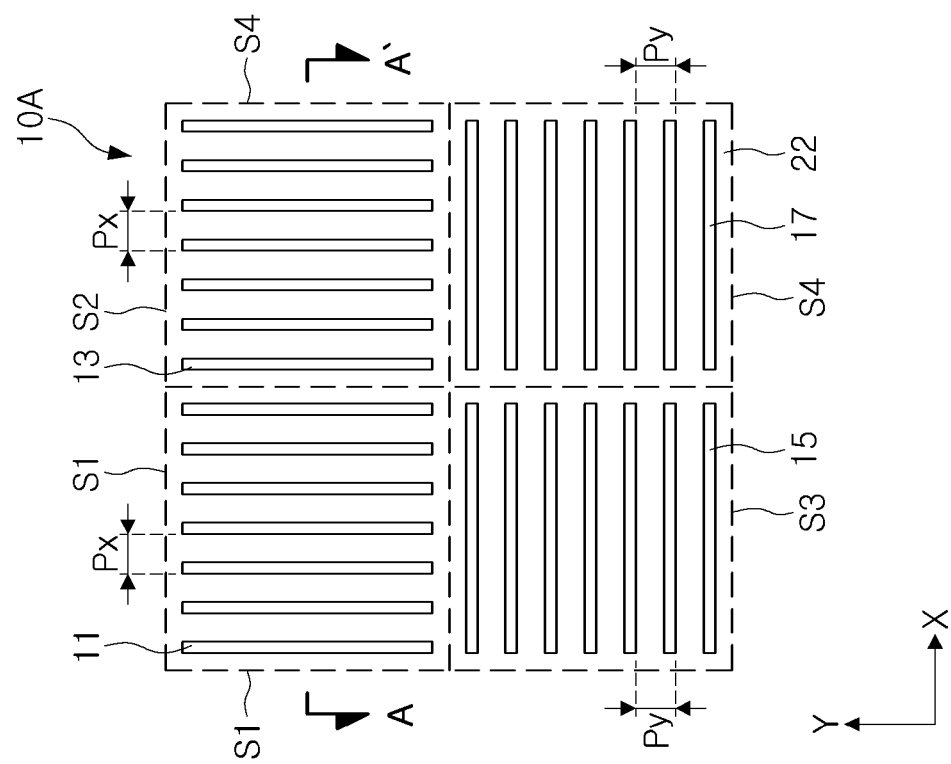
FIG. 13

DIFFRACTION-BASED OVERLAY MARKS AND METHODS OF OVERLAY MEASUREMENT

CROSS-REFERENCE TO RELATED APPLICATIONS

This application claims benefit of priority to Korean Patent Application No. 10-2016-0073919, filed on Jun. 14, 2016 in the Korean Intellectual Property Office, the disclosure of which is incorporated herein by reference in its entirety.

BACKGROUND

1. Field

The present inventive concepts relate to a diffraction-based overlay (DBO) mark and methods of overlay measurement.

2. Description of Related Art

In a process of manufacturing a semiconductor device, an exposure process may be performed to form a micropattern on a semiconductor substrate. Such an exposure process may include a process of forming a photoresist pattern on a semiconductor substrate, measuring an alignment state of the formed photoresist pattern, and determining a follow-up process according to alignment errors.

The process of measuring an alignment state of a photoresist pattern on a semiconductor substrate may be performed by a process of measuring an overlay error. Such an overlay error measurement process may allow for confirmation as to whether a pattern (for example, a photoresist) disposed on an upper lower of a semiconductor substrate is accurately aligned with respect to a pattern (for example, an insulator, a semiconductor, or a metal) disposed on a lower layer of the semiconductor substrate.

SUMMARY

Some example embodiments provide overlay marks which may compensate for a trend in which a beam may be diffracted, more accurately, according to a bias value.

Some example embodiments provide methods of measuring an overlay which may compensate for a trend in which a beam may be diffracted, more accurately, according to a bias value.

According to some example embodiments, a method may include: forming a first overlay mark having a first grating and a third grating on a first level, the first grating and the third grating periodically arranged in a first direction; forming a second overlay mark having a second grating and a fourth grating, periodically arranged in a second direction on a second level different from the first level, such that the first grating and the second grating are substantially parallel to each other in a region of vertical overlap of the first grating and the second grating, and the third grating and the fourth grating are tilted with respect to each other in a region of vertical overlap of the third grating and the fourth grating; directing a beam to be incident to the first overlay mark and the second overlay mark; measuring an intensity of a first diffracted beam from the first grating and the second grating, based on the directed beam being incident to the first overlay mark; generating trend information associated with a second diffracted beam based on measuring an intensity of a second diffracted beam from the third grating and the fourth grating along a length direction of the third grating, based on the directed beam being incident to the second overlay mark, wherein the trend information indicates a relationship between the intensity of a diffracted beam and a bias value; and determining an overlay error based on the measured intensity of the first diffracted beam and the generated trend information associated with the second diffracted beam; and selectively incorporating at least the second overlay mark into a semiconductor device, based on whether the overlay error at least meets a threshold error values, the selectively incorporating including performing one of, re-processing at least the second overlay mark, based on a determination that the overlay error at least meets the threshold error level, or forming the semiconductor device, using at least the second overlay mark, based on a determination that the overlay error is less than the threshold error level.

According some example embodiments, a method may include: forming a first grating and a second grating on different levels according to at least one lithography process, such that the second grating at least partially vertically overlaps with the first grating, the first grating and the second grating have a substantially common pitch, and the first grating and the second grating are inclined with respect to each other, such that a bias value that indicates a bias between the first grating and the second grating varies along a length direction of the first and second gratings; directing a beam to the first and second gratings; and generating trend information associated with a diffracted beam based on an image pattern of a beam, diffracted by the first grating and the second grating, using the emitted beam, wherein the trend information indicates a relationship between an intensity of the diffracted beam and the bias value; and selectively incorporating at least the second overlay mark into a semiconductor device, based on whether the overlay error at least meets a threshold error values, the selectively incorporating including performing one of, re-processing at least the second overlay mark, based on a determination that the overlay error at least meets the threshold error level, or forming the semiconductor device, using at least the second overlay mark, based on a determination that the overlay error is less than the threshold error level.

According to some example embodiments, a method may include: directing a first beam and a second beam to be incident to a first overlay mark and a second overlay mark, the first overlay mark including a first grating and a third grating periodically arranged in a first direction on a first level, the second overlay mark including a second grating and a fourth grating, periodically arranged in a second direction on a second level different from the first level, the first grating and the second grating being substantially parallel to each other in a region of vertical overlap of the first grating and the second grating, the third grating and the fourth grating being tilted with respect to each other in a region of vertical overlap of the third grating and the fourth grating, the first beam and the second beam being incident in opposite horizontal directions; measuring an intensity of a first diffracted beam from the first grating and the second grating, based on the first beam and the second beam incident to the first overlay mark; measuring an intensity of a second diffracted beam from the third grating and the fourth grating at a plurality of locations along a length direction of the third grating, based on the first beam and the second beam incident to the second overlay mark; determining a relationship between an intensity of a diffracted beam and a bias value, based on the variation of the measured intensity of the second diffracted beam along the length direction of the third grating; and determining an overlay error based on the measured intensity of the first diffracted beam and the determined relationship; and selectively incorporating at least the second overlay mark into a semiconductor device, based on whether the overlay error at least meets a threshold error values, the selectively incorporating including performing one of, re-processing at least the second overlay mark, based on a determination that the overlay error at least meets the threshold error level, or forming the semiconductor device, using at least the second overlay mark, based on a determination that the overlay error is less than the threshold error level.

BRIEF DESCRIPTION OF THE DRAWINGS

The above, and other aspects, features, and advantages of the present disclosure will be more clearly understood from the following detailed description when taken in conjunction with the accompanying drawings, in which:

FIG. 6A is an enlarged plan view of region M of the overlay mark illustrated in FIG. 1;

FIG. 6B is a cross-sectional view of an overlay mark disposed on a certain point in a region illustrated in FIG. 6A;

FIG. 6C is an image pattern diagram illustrating the intensity of a beam from an overlay mark illustrated in FIG. 6A;

FIG. 6D is a graph of changes in the intensity of a diffracted beam along a length direction;

FIG. 13, FIG. 14, FIG. 15, FIG. 16, and FIG. 17 are views illustrating a method of manufacturing a semiconductor device according to some example embodiments.

DETAILED DESCRIPTION

Hereinafter, example embodiments of the present disclosure will be described in detail with reference to the attached drawings.

Figure 1:
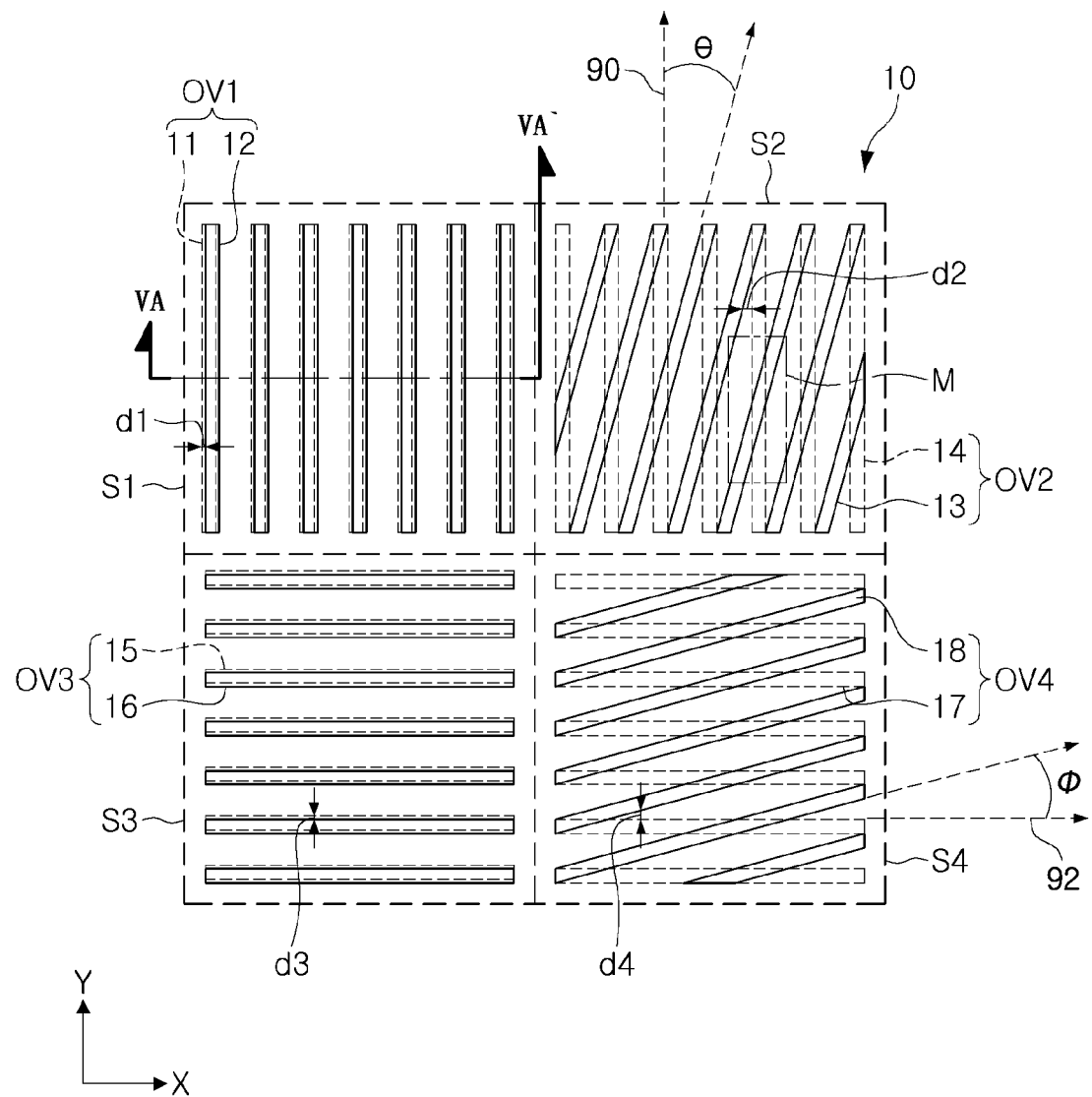
FIG. 1 is a plan view of an overlay mark according to some example embodiments.
Figure 2A:
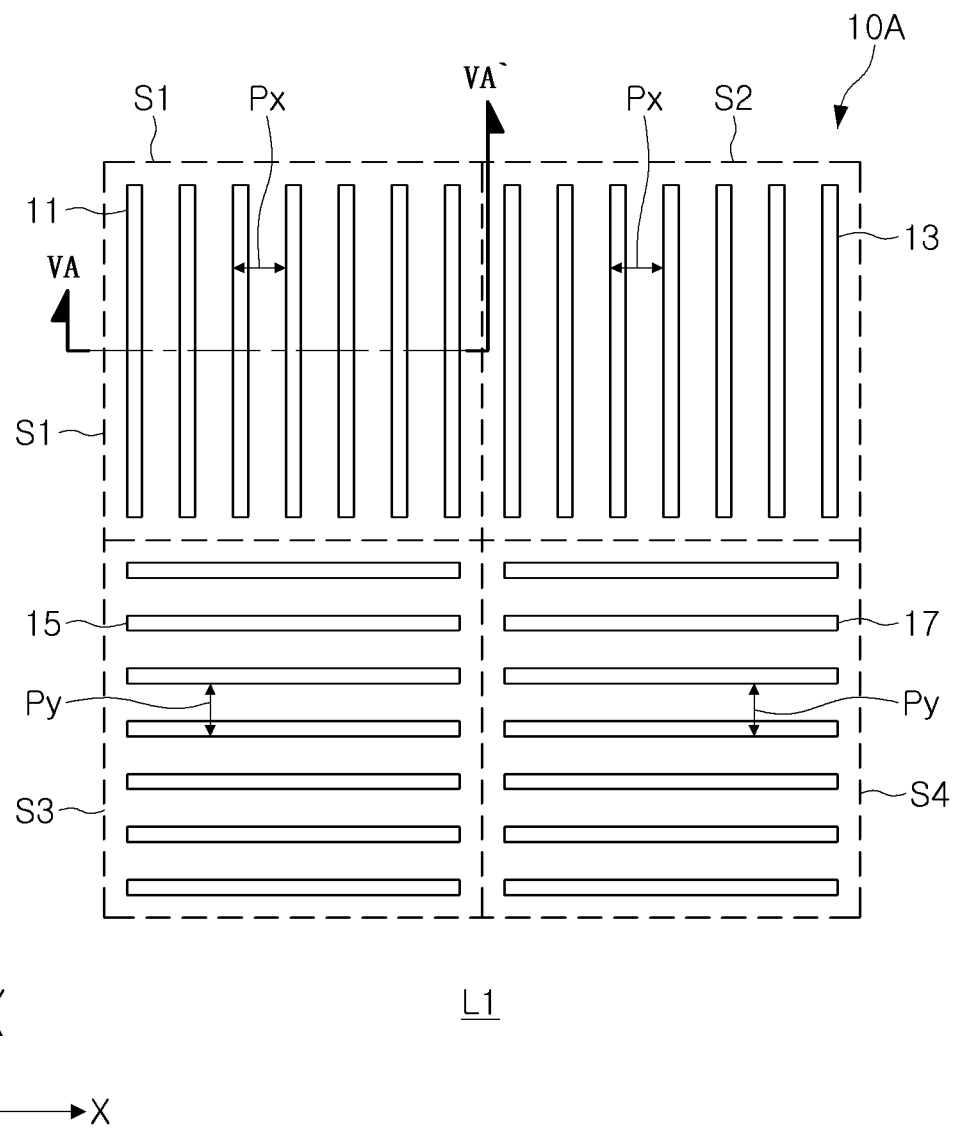
FIG. 2A and FIG. 2B are plan views of gratings disposed on first and second levels of the overlay mark illustrated in FIG. 1.
Figure 2B:
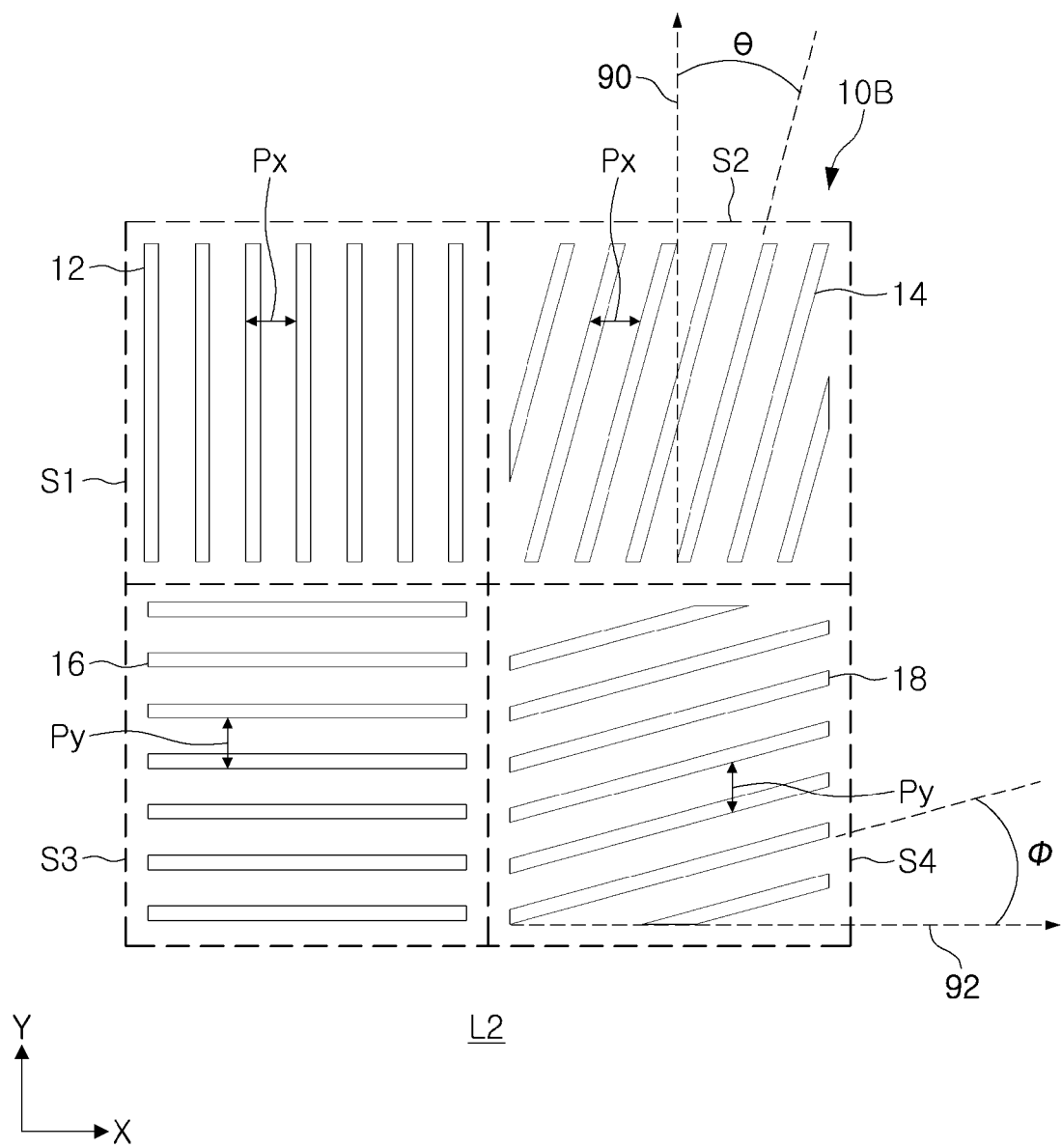

FIG. 1 is a plan view of an overlay mark according to some example embodiments of the present inventive concepts. FIGS. 2A and 2B are plan views of a first overlay mark and a second overlay mark disposed on different levels.

A overlay mark 10, illustrated in FIG. 1, may have a structure in which a first overlay mark 10A, illustrated in FIG. 2A, and a second overlay mark 10B, illustrated in FIG. 2B, may vertically overlap each other.

The first and second overlay marks 10A and 10B may be disposed on first and second levels L1 and L2, respectively. In some example embodiments, the second level L2 may be disposed above the first level L1. In some example embodiments, the second level L2 may be disposed below the first level L1. The first level L1 may be formed of (e.g., at least partially comprise) a substrate material or an interlayer insulating material. The first overlay mark 10A, disposed on the first level L1, may include a material different from that of the first level L1, for example, a dielectric such as a silicon oxide, or a metal such as tungsten (W) or copper (Cu). In some example embodiments, the second overlay mark 10B, disposed on the second level L2, may include a photoresist pattern.

Figure 3:
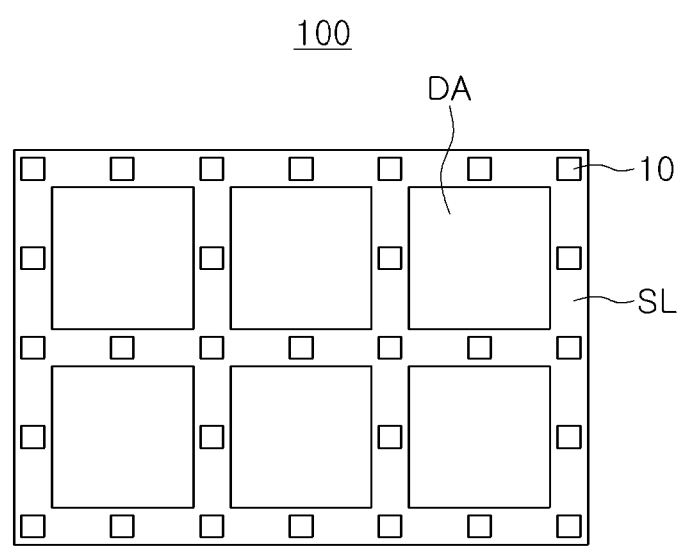
FIG. 3 is a schematic view of the layout of a substrate including an overlay mark.

The overlay mark 10 may be disposed on a scribe lane SL, as illustrated in FIG. 3. A substrate 100, illustrated in FIG. 3, may include one or more device areas (DA) in which a semiconductor chip is formed, and an SL region surrounding the one or more DAs. The SL may have an align key, as well as the overlay mark 10, disposed thereon.

In a process of manufacturing a semiconductor device, in some example embodiments, a process of forming a desired pattern on the substrate 100 by using a plurality of masks or reticles, the align key, and the overlay mark 10 may be used for an accurate alignment of the desired pattern. The align key may be configured to align the masks or reticles on a desired location on the substrate 100. The overlay mark 10 may be used to confirm whether a desired pattern, for example, a photoresist pattern, is accurately disposed on a location after forming the desired pattern through a lithography process. A difference between a preliminarily formed reference pattern and the formed pattern, for example, an overlay error, may be measured so as to reform a pattern or adjust the location of a follow-up pattern.

For example, if the overlay error is determined to at least meet a threshold error value, the pattern (e.g., photoresist pattern) may be reformed, replaced, discarded, some combination thereof, or the like. If and/or when the overlay error does not at least meet the threshold error value (e.g., is less than the threshold error value), the pattern may be incorporated into the manufacture of a semiconductor device.

In some example embodiments, each overlay mark of the first and second overlay marks 10A and 10B may be divided into four cells S1 to S4 disposed in a 2×2 matrix, and the cells S1 to S4 may collectively have first to eighth gratings 11, 12, 13, 14, 15, 16, 17, and 18 (also referred to as "periodic structures") arranged at regular intervals. Here, the cells S1 to S4 may also be included in the term "overlapping region" of the first and second levels L1 and L2 on which the first to eighth gratings 11, 12, 13, 14, 15, 16, 17, and 18 may be disposed. Each grating of the first to eighth gratings 11, 12, 13, 14, 15, 16, 17, and 18 may include a plurality of lines having substantially the same width (e.g., the same width within manufacturing tolerances and/or material tolerances).

As illustrated in FIG. 1, the respective cells S1, S2, S3, and S4 may be provided as first to fourth overlapping grating structures OV1, OV2, OV3, and OV4, respectively. The first, third, fifth, and seventh gratings 11, 13, 15, and 17 of the first overlay mark 10A and the second, fourth, sixth, and eighth gratings 12, 14, 16, and 18 of the second overlay mark 10B may vertically overlap each other in each of the first to fourth overlapping grating structures OV1 to OV4.

The first and second overlapping grating structures OV1 and OV2 may be used as a diffraction-based overlay (DBO) in order to obtain bias information in an x direction. Further, the third and fourth overlapping grating structures OV3 and OV4 may be used as a DBO in order to obtain bias information in a y direction.

First, in the first and second overlapping grating structures OV1 and OV2, the first and third gratings 11 and 13, disposed on the first level L1, may be periodically arranged in the x direction. The first and third gratings 11 and 13 may be arranged to have substantially the same pitch Px (e.g., the same pitch within manufacturing tolerances and/or material tolerances).

The second grating 12, disposed on the second level L2, may be disposed in a region of overlap S1 of the first and second gratings 11 and 12, and may be arranged parallel or substantially in parallel (e.g., parallel within manufacturing tolerances and/or material tolerances) to the first grating 11 to have substantially the same pitch Px. In some example embodiments, the first and second gratings 11 and 12 may be preliminarily biased from each other in the x direction by a desired (and/or, alternatively, predetermined) bias value d1. As such, the first and second gratings 11 and 12, arranged in parallel to each other, may be configured to vertically overlap each other to thus provide the first overlapping grating structure OV1.

The fourth grating 14, disposed on the second level L2, may be disposed in a region of overlap S2 of the third and fourth gratings 13 and 14. The fourth grating 14 may be arranged to (e.g., "configured to") have substantially the same pitch Px, and may be inclined ("tilted") with respect to ("in relation to") the third grating 13. In some example embodiments, the third grating 13 may be accurately arranged in the x direction, and the fourth grating 14 may be inclined at a desired (and/or, alternatively, predetermined) tilt angle θ with respect to the third grating 13. Where the fourth grating extends along an axis 90, as shown in FIG. 1, the third grating 13 may be inclined at a tile angle θ with respect to the axis 90. In some example embodiments, an inclined arrangement ("configuration") may be provided by tilting only the third grating 13 or tilting both the third grating 13 and the fourth grating 14 with regard to axis 90. When all of the third and fourth gratings 13 and 14 are inclined with regard to axis 90, tilts of the third grating 13 and the fourth grating 14 with regard to axis 90 may be different from each other, and the third and fourth gratings 13 and 14 may have a contact point therebetween.

In such an inclined arrangement, a bias value d2 between the third and fourth gratings 13 and 14 may periodically vary depending on a length direction along axis 90 thereof.

Using the first overlapping grating structure OV1, the intensity of a diffracted beam, in which an actual bias value is reflected, may be measured. Using the second overlapping grating structure OV2, changes in the intensity of a diffracted beam, for example, trend information on a diffracted beam according to a bias value may be obtained, depending on changes in the bias value. Using such trend information, the intensity of a diffracted beam, measured from the first overlapping grating structure OV1, may be converted into a bias value, and an overlay error in the x direction may be accurately obtained.

Similarly to the first and second overlapping grating structures OV1 and OV2, the fifth to eighth gratings 15 to 18, arranged in the y direction, may form the third and fourth overlapping grating structures OV3 and OV4.

In detail, the fifth and seventh gratings 15 and 17, disposed on the first level L1, may be arranged to have substantially the same pitch Py in the y direction. The sixth and eighth gratings 16 and 18, disposed on the second level L2, may be arranged to have substantially the same pitch Py in a region of overlap S3 of the fifth and sixth gratings 15 and 16 and a region of overlap S4 of the seventh and eighth gratings 17 and 18. If necessary, the fifth and sixth gratings 15 and 16 may be preliminarily biased from each other in the y direction by a desired (and/or, alternatively, predetermined) bias value d3.

As such, the fifth and sixth gratings 15 and 16 may be arranged in parallel to each other in the y direction in the third overlapping grating structure OV3, while the seventh and eighth gratings 17 and 18 may be inclined with respect to each other and in regard to axis ("directional axis") 92 in the y direction in the fourth overlapping grating structure OV4. For example, where grating 18 is aligned with axis 92, grating 17 may be tilted in regard to axis 92, and thus in further regard to grating 18, by tilt angle Φ. Thus, a bias value d4 may periodically vary, depending on a length direction of the seventh and eighth gratings 17 and 18.

Using the third overlapping grating structure OV3, the intensity of a diffracted beam, in which an actual bias value is reflected, may be measured. Using the fourth overlapping grating structure OV4, trend information on a diffracted beam according to the bias value d4 may be obtained, depending on changes in a bias value. Using such trend information, the intensity of a diffracted beam, measured from the third overlapping grating structure OV3, may be converted into a bias value to obtain an overlay error in the y direction.

Figure 4:
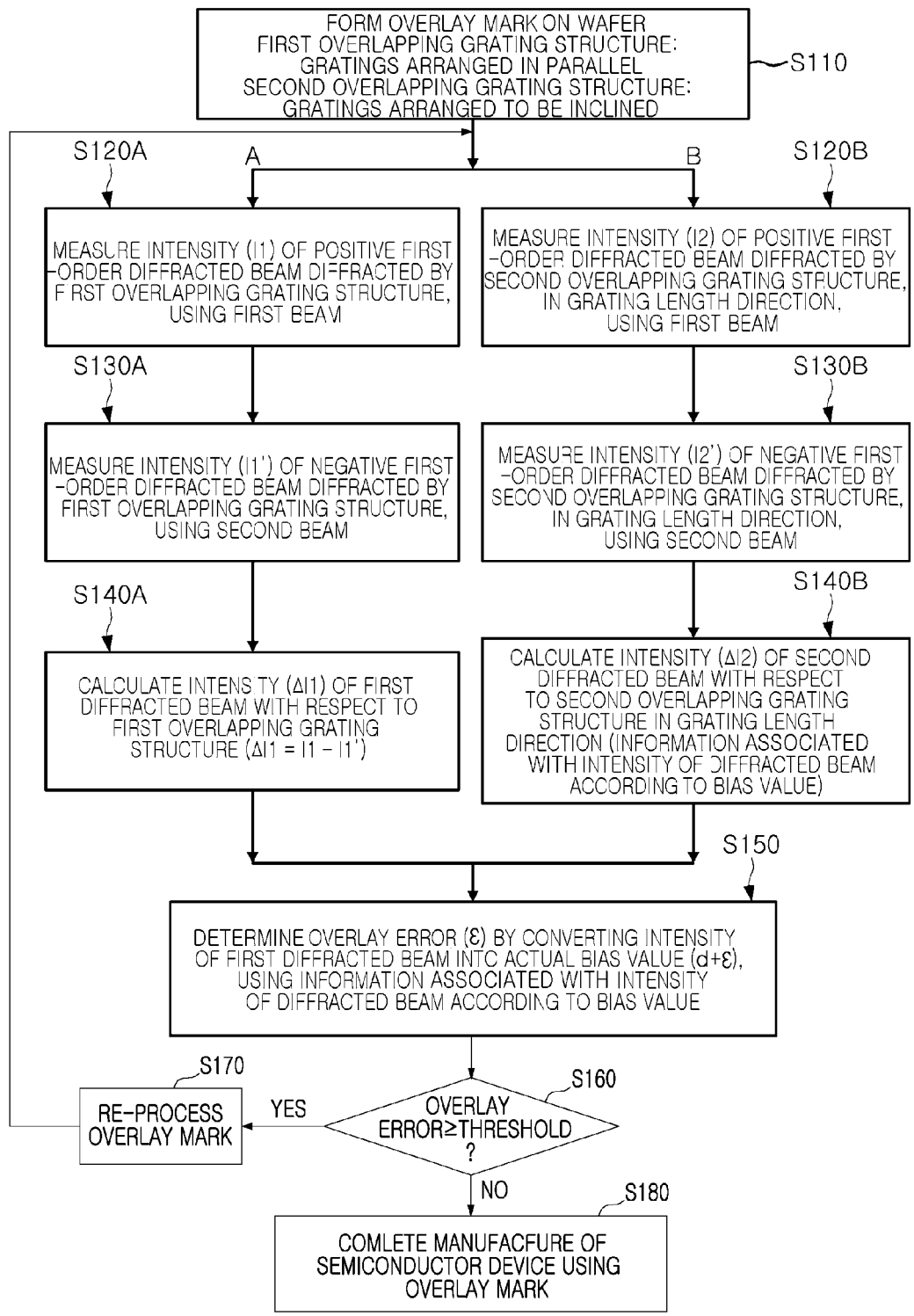
FIG. 4 is a process of measuring an overlay error according to some example embodiments.

FIG. 4 is a process according to some example embodiments of the present inventive concepts. In some example embodiments, one or more of the operations illustrated in FIG. 4 may be implemented by execution, of program instructions stored on a memory, by a processor (e.g., CPU, processing circuitry, etc.). For example, some or all of the operations illustrated in FIG. 4 may be executed by some or all of the elements of the electronic device 1800 illustrated in FIG. 18.

The process, illustrated in FIG. 4, will be described with reference to the overlay mark 10, illustrated in FIG. 1. For convenience of description, a process of measuring an overlay error in the x direction using the first and second overlapping grating structures OV1 and OV2, will be primarily described.

First, the overlay mark 10, illustrated in FIG. 1, may be provided (e.g., "formed," "applied," "manufactured," etc.) on SL of a wafer (also referred to as a "substrate"), using a lithography process (S110).

The overlay mark 10 may include the first and second overlapping grating structures OV1 and OV2, as illustrated in FIG. 1. The first overlapping grating structure OV1 may include the first and second gratings 11 and 12 arranged in parallel to each other in the x direction in the region of overlap S1. The second overlapping grating structure OV2 may include the third and fourth gratings 13 and 14 arranged in the x direction and inclined with respect to each other in the region of overlap S2. In a lithography process for manufacturing a semiconductor device, a process of forming an overlay mark 10 will be described in detail with reference to FIGS. 15 through 17.

As referred to herein, a grating may include a set of grating elements that collectively extend in parallel in a particular direction, where the particular direction may be referred to herein as a length direction associated with the grating. For example, as shown in FIG. 1, the first grating 11 includes a set of seven grating elements that extend in parallel in a length direction that is substantially aligned (e.g., aligned within manufacturing tolerances and/or material tolerances) with the y direction. The first grating 11 may be referred to as being arranged and/or periodically arranged in the x direction, as the grating elements of the first grating 11 are spaced apart in the x direction according to a particular period p1. Additional gratings described herein will be understood to include grating elements that may be periodically arranged in a certain direction (sometimes referred to as a width direction) and may extend in parallel with each other in a length direction. The length direction may be different from a direction that is orthogonal to the width direction or a direction that is aligned or substantially aligned with the direction that is orthogonal to the width direction.

Subsequently to providing ("forming") the overlay mark 10, the intensity of a diffracted beam may be measured by emitting and/or directing a beam to the overlay mark 10.

In some example embodiments, measurement A of a diffracted beam, diffracted by the first overlapping grating structure OV1, and measurement B of a diffracted beam, diffracted by the second overlapping grating structure OV2, may be individually performed. Measurements A and B may be performed in random order or simultaneously. In some example embodiments, if and/or when the size of a beam is sufficient, measurements A and B of the two overlapping grating structures OV1 and OV2 may be performed simultaneously using a common beam emitted and/or directed to the overlay mark 10.

Measurement A of a diffracted beam, diffracted by the first overlapping grating structure OV1, may start from a process of generating and directing a first beam B(+) to be incident to the first overlapping grating structure OV1 and measuring the intensity I1 of a positive first-order diffracted beam S1(+) (refer to FIG. 5A) diffracted by the first overlapping grating structure OV1 by using the first beam B(+)(S120A).

Figure 5A:
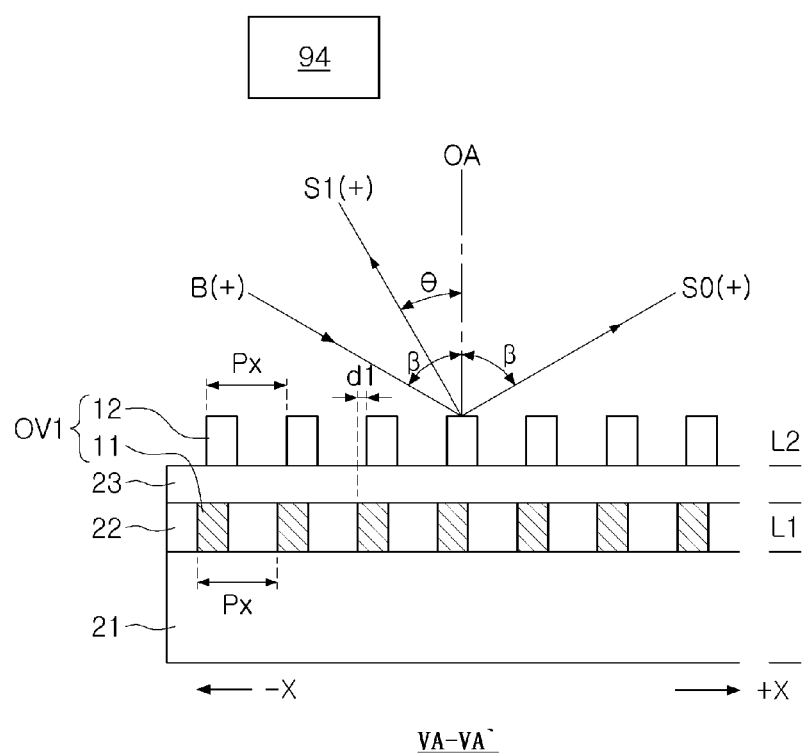
FIG. 5A and FIG. 5B are cross-sectional views of overlapping gratings in the overlay mark illustrated in FIG. 1.

FIG. 5A is a cross-sectional view of the first overlapping grating structure OV1 of the overlay mark 10 illustrated in FIG. 1, and illustrates the process of measuring the intensity I1 of the positive first-order diffracted beam S1(+) (S120A). As an example, in which an actual overlay mark is formed, the first grating 11 may be formed on a semiconductor substrate 21, an interlayer insulating layer 22 may be disposed between portions of the first grating 11, and the second grating 12 as a photoresist pattern may be disposed on the interlayer insulating layer 22 (refer to FIGS. 13 through 17). As illustrated in FIG. 5A, a first beam B(+) may be generated ("emitted") and may be directed to be incident to the first overlapping grating structure OV1 at a first angle of incidence β with respect to a surface normal OA in a first horizontal direction +x (the horizontal direction may be referred as a grating arranging direction and/or a width direction in this specification).

As shown in FIG. 5A, the incident first beam B(+) may be scattered by the first and second gratings 11 and 12 so as to form at least a positive first-order diffracted beam S1(+) and a positive zero-order diffracted beam S0(+). In some example embodiments, two or more high-order diffracted beams may be ignored. The positive zero-order diffracted beam S0(+) may be reflected in a regular reflection manner, while the positive first-order diffracted beam S1(+) may be diffracted at a theta θ angle on the semiconductor substrate 21. The positive first-order diffracted beam S1(+) may be captured as an image pattern by using a scatterometer 94 to receive and detect the positive first-order diffracted beam S1(+), and the intensity I1 of the positive first-order diffracted beam S1(+) may be obtained ("determined") by processing the captured image pattern.

Subsequently, using a second beam B(−), the intensity I1' of a negative first-order diffracted beam S1(−) diffracted by the first overlapping grating structure OV1 may be measured (S130A).

Figure 5B:
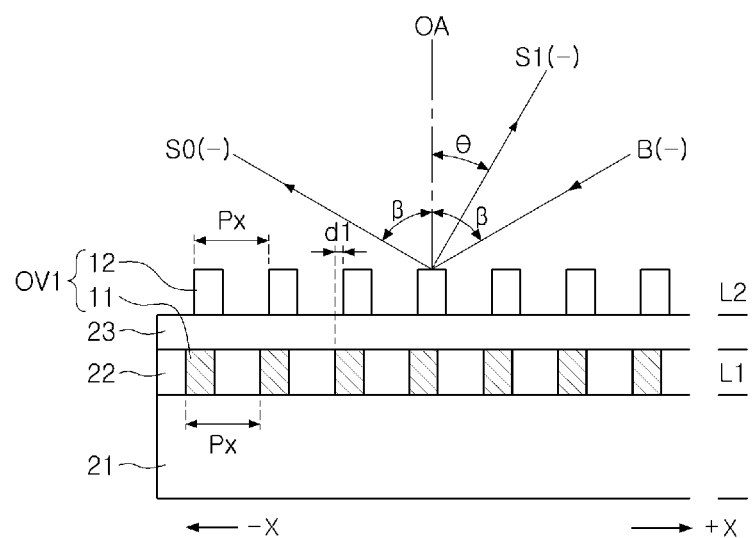

This measurement process may proceed similarly to the process of measuring the intensity I1 of the positive first-order diffracted beam S1(+) (S120A). The intensity I1' of the negative first-order diffracted beam S1(−) may be measured by emitting ("generating") and directing the second beam B(−) in a second horizontal direction −x opposite to the first horizontal direction +x of the first beam B(+). In detail, as illustrated in FIG. 5B, (S130A) may include directing the second beam B(−) to be incident to the first overlapping grating structure OV1 at the first angle of incidence β in the second horizontal direction −x so as to form the negative first-order diffracted beam S1(−) and a negative zero-order diffracted beam S0(−) similarly to the foregoing measurement process. Here, the intensity I1' of the negative first-order diffracted beam S1(−) may be measured using the scatterometer 94.

The intensity of a first diffracted beam, diffracted by the first overlapping grating structure OV1, may be obtained ("determined") from a difference between the intensity I1 of the positive first-order diffracted beam S1(+) and the intensity of I1' of the negative first-order diffracted beam S1(−) (S140A). In some example embodiments, the first beam and the second beam may be a common beam (e.g., a two-mode beam), such that the first diffracted beam and the second diffracted beam may be measured based on a common beam that is incident on the first overlapping grating structure OV1. The intensity ($\Delta I1$) of the first diffracted beam may be calculated by the Formula: $\Delta I1=I1-I1'$. The intensity ($\Delta I1$) of the first diffracted beam may include a bias value in the x direction, for example, location information related to an overlay error, and a method of converting the bias value into location information, for example, an overlay error, may be obtained from a process of measuring the intensity of a diffracted beam diffracted by the second overlapping grating structure OV2 (B of FIG. 4).

In some example embodiments illustrated in FIGS. 5A and 5B, the first beam B(+) and the second beam B(−) may be incident to be inclined at desired (and/or, alternatively, predetermined) angles of incidence in directions opposite to directions of the positive first-order diffracted beam S1(+) and the negative first-order diffracted beam S1(−) As noted above, the first beam B(+) and the second beam B(−) may, in some example embodiments, be a common beam (e.g., a two-mode beam). In some example embodiments, the method of converting the bias value into location information may be implemented using a manner of allowing a beam to be incident in a direction of OA so as to simultaneously generate a positive first-order diffracted beam S1(+) and a negative first-order diffracted beam S1(−) and measuring the generated positive first-order diffracted beam S1(+) and negative first-order diffracted beam S1(−) simultaneously.

In some example embodiments, measurement B of a diffracted beam, diffracted by the second overlapping grating structure OV2, arranged in diagonal form, may be performed similarly to the above-mentioned measurement A of a diffracted beam diffracted by the first overlapping grating structure OV1.

First, using the first beam B(+), the intensity I2 of the positive first-order diffracted beam S1(+), diffracted by the second overlapping grating structure OV2, may be measured (S120B). Subsequently, using the second beam B(−), the intensity of I2' of the negative first-order diffracted beam S1(−), diffracted by the second overlapping grating structure OV2, may be measured (S130B).

In this process, unlike in the foregoing measurement process A (S120A-S130A), the intensities I2 and I2' of the positive and negative first-order diffracted beams S1(+) and S1(−) may be measured in the length direction of the first to eighth gratings 11 to 18, for example, the y direction. Such measurement may include measuring the intensities I2 and I2' at different distances and/or points ("locations") along the length direction (e.g., the y direction), based on the first and second beams B(+) and B(−) that are incident to the second overlapping grating structure OV2 in opposite horizontal directions (e.g., the x direction).

In the second overlapping grating structure OV2, the third and fourth gratings 13 and 14 may be inclined with respect to each other to allow the bias value d2 to vary along the length direction thereof. Thus, the intensity of a diffracted beam, measured in the length direction of the first to eighth gratings 11 to 18, may also be changed. A difference (I2-I2') between the intensities I2 and I2' of the positive and negative first-order diffracted beams S1(+) and S1(−) in the length direction of the first to eighth gratings 11 to 18, may be computed to thus obtain the intensity (ΔI2) of a second diffracted beam diffracted by the second overlapping grating structure OV2 (S140B). The intensity may thus be calculated for each distance and/or point ("location"), of a plurality of distances and/or points ("locations"), along the length direction. Thus, the intensity may be calculated as a function of the distance along the length direction.

In some example embodiments, in the second overlapping grating structure OV2, each of the inclined third and fourth gratings 13 and 14 may be arranged with the same or substantially the same period p1 (e.g., the same period within manufacturing tolerances and/or material tolerances), and various bias values d2 of the third and fourth gratings 13 and 14 in the grating arranging direction x may be constant. Thus, the sum of the intensities of diffracted beams in the grating arranging direction x or the average of the intensities in a certain section may be calculated, and the calculated value may represent as the intensity of a diffracted beam in the length direction of the first to eighth gratings 11 to 18, for example, the y direction.

Measurement B of a diffracted beam, diffracted by the second overlapping grating structure OV2, will be described in more detail with reference to FIGS. 6A through 6D.

FIG. 6A is an enlarged plan view of region M of the second overlapping grating structure OV2 of the overlay mark 10 illustrated in FIG. 1. FIG. 6B is a cross-sectional view of certain points y1 to y5 of region M, and illustrates a degree of bias between the third and fourth gratings 13 and 14 on each of the points y1 to y5. As illustrated in FIGS. 6A and 6B, the bias value d2 between the third and fourth gratings 13 and 14 may continuously vary depending on a distance (also referred to as "location") along the length direction of the first to eighth gratings 11 to 18, for example, the y direction.

FIG. 6C is an image pattern diagram illustrating the intensity (ΔI2) of a beam diffracted by an overlay mark illustrated in FIG. 6A, where the intensity varies according to location along the length direction. The intensity of a diffracted beam may be zero (e.g., a null intensity) on the location y3, on which the third and fourth gratings 13 and 14 may completely match each other, and on the locations y1 and y5, on which the third and fourth gratings 13 and 14 may have a maximum bias value therebetween. Depending on changes in a bias value in sections between the locations y1, y3, and y5, the intensity of a diffracted beam may be represented by a sinusoidal wave curve in the length direction of the first to eighth gratings 11 to 18, for example, the y direction, as illustrated in FIG. 6D. Thus, a relationship between the intensity of a diffracted beam and a bias value may be determined and represented (indicated) by a trend ("trend line"). The expected intensity of a diffracted beam on each of the locations y1 to y5 or according to a bias value may be represented by the sum of intensities of diffracted beams in the grating arranging direction x or the average of the intensities in a certain section.

Next, using a trend ("trend line"), in which the intensity (ΔI2) of the second diffracted beam in the length direction of the first to eighth gratings 11 to 18, for example, the y direction, generated from the second overlapping grating structure OV2, varies according to bias value, the intensity (ΔI1) of the first diffracted beam, obtained from the first overlapping grating structure OV1, may be converted into an actual bias value. Then, an overlay error may be obtained from the actual bias value.

Figure 7:
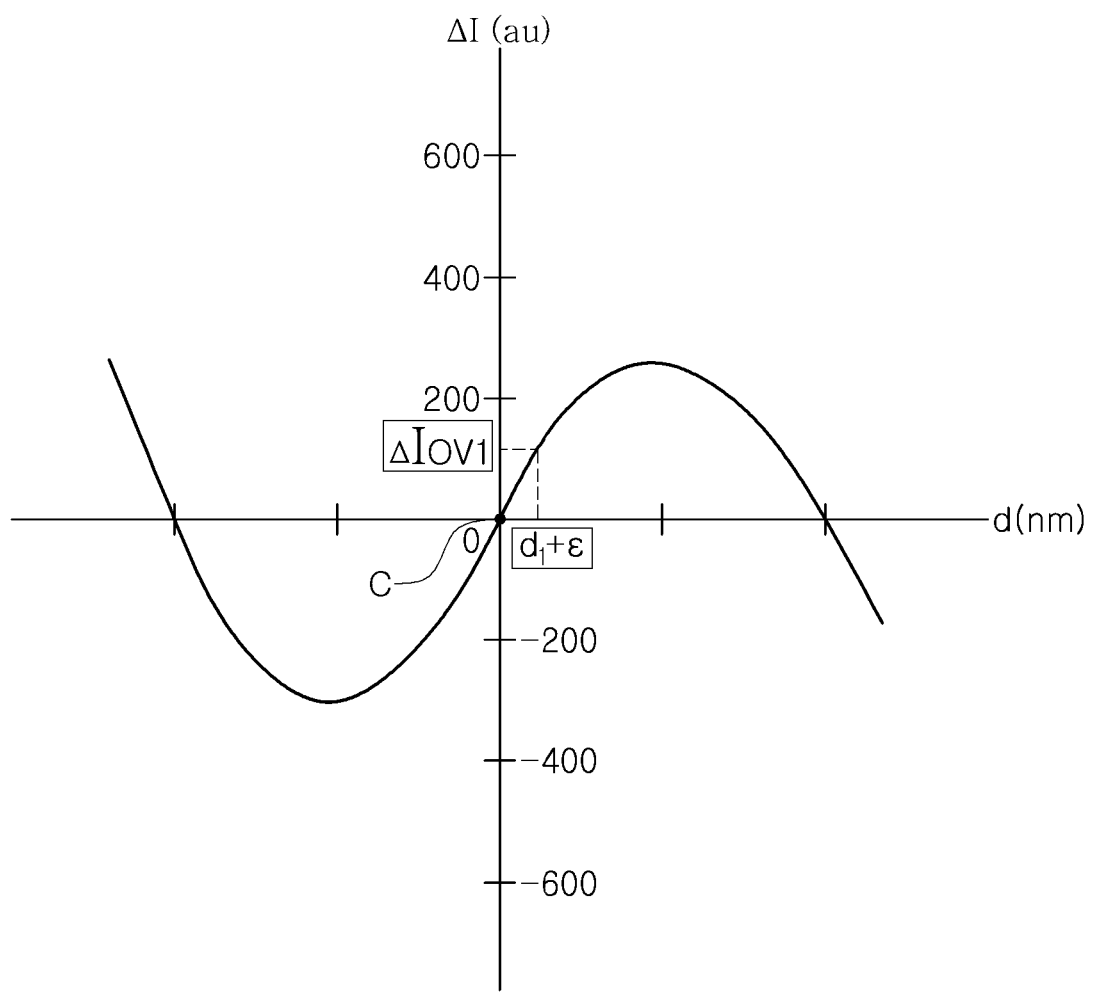
FIG. 7 is the graph illustrated in FIG. 6D, which illustrates a process of converting the measured intensity of a diffracted beam into an overlay error.

Referring to FIG. 7, a process of obtaining an overlay error (S150) will be described.

A graph, illustrated in FIG. 7, may be understood as the sinusoidal wave curve of the diffracted beam, illustrated in FIG. 6D, the sinusoidal wave curve being rotated by an angle of about 90 degrees in a counterclockwise direction. As noted above, the curve may be a trend that represents a relationship between intensity of the diffracted beam and a bias value (e.g., a bias between vertically overlapping gratings). Here, an x axis may represent a bias value d as the length direction of the first to eighth gratings 11 to 18, and a y axis may represent the intensity of the diffracted beam.

It may be seen that when the intensity of the first diffracted beam, obtained in S140A, is $\Delta I_{OV1}$, an actual bias value d is represented by d1+∈, using a sinusoidal wave curve that may indicate changes in the intensity of a diffracted beam according to a bias value. Here, it may be seen that an overlay error occurs by c, due to the preset ("known") bias value d1 of the first overlapping grating structure OV1. The preset bias value d1 may be a known value, such that the overlay error c may be determined based on ∈=d−d1, where d is determined based on applying $\Delta I_{OV1}$ to a trend ("trend line") that represents ΔI=f(d). When c is greater than an allowable error value (e.g., at least meets a threshold value) (S160=YES), other adjustments, for example, re-processing after removal of a photoresist pattern (e.g., at least partial removal of one or more overlay marks, re-formation of one or more overlay marks, replacement of one or more overlay marks, etc.), may be additionally performed (S170). The re-processed photoresist pattern may then be subjected to a repetition of operations (S120A/B-S160) for at least a certain quantity of iterations and/or until the overlay error determined at (S150) does not at least meet the threshold error value. In some example embodiments, the photoresist pattern is discarded if the overlay error determined at (S150) at least meets the threshold error value.

As shown in FIG. 4, the method according to some example embodiments may include manufacturing ("forming") a semiconductor device using at least a portion of the overlay mark (e.g., the second overlay mark, the first overlay mark, some combination thereof, etc.) (S180), subsequent to a determination that the overlay error does not at least meet the threshold error level (S160=N0). For example, where the second overlay mark is a photoresist pattern on a wafer, the photoresist pattern may be incorporated into a semiconductor device, as part of the manufacture of the semiconductor device, if and/or when the overlay error determined at (S150) is less than a threshold error value.

The incorporation of an overlay mark into the manufacture of a semiconductor device at (S180) or the re-processing of an overlay mark at (S170) based on whether the overlay error at least meets a threshold error value may be referred to herein as selectively incorporating at least the second overlay mark into a semiconductor device, based on whether the overlay error at least meets a threshold error values, where the selectively incorporating including performing one of re-processing at least the second overlay mark, based on a determination that the overlay error at least meets the threshold error level, or forming the semiconductor device, using at least the second overlay mark, based on a determination that the overlay error is less than the threshold error level.

The device manufactured at (S180) may include one or more of a semiconductor device, chip device, integrated circuit device, computer device, electronic device, some combination thereof, or the like. In some example embodiments, a wafer that includes one or more overlay marks, including one or more photoresist patterns, may be selectively and/or at least partially incorporated into the manufacturing of the device at (S180) based on the overlay error determined at (S150).

In view of at least the above, the application of the process illustrated in at least FIG. 4 to the manufacture of semiconductor devices that include patterns (e.g., photoresist patterns on wafers) may result in improved quality of semiconductor devices, as the overlay error of patterns (e.g., photoresist patterns on wafers) included in the semiconductor devices may be thus reduced. Accordingly, the lifespan and operation of manufactured semiconductor devices may be improved.

A process of obtaining a bias value in the y direction by using the third and fourth overlapping grating structures OV3 and OV4 of the overlay mark 10 illustrated in FIG. 1, is not described, and may, however, be applied similarly to the foregoing process using the first and second overlapping grating structures OV1 and OV2.

Thus, in the process of measuring a bias value using the overlay mark 10 illustrated in FIG. 1, a bias value in the y direction as well as a bias value in the x direction may be calculated.

In the above example embodiments, the process of obtaining a bias value, for example, an overlay error, is described, and the obtained bias value may also be used as monitoring data on influence on the process by using only an overlay mark having an inclined grating.

Referring to measurement B of FIG. 4 and the process, illustrated in FIG. 6, the intensity of a diffracted beam in the length direction of the first to eighth gratings 11 to 18 (e.g., (ΔI2)) may be measured, and a trend, in which a diffracted beam may be diffracted, may be represented by a curve. As a result, as illustrated in FIG. 7, the curve may appear to be close to an ideal sinusoidal wave curve, or deviate from a sinusoidal wave curve. For example, according to an influence on the process or measurement conditions, a trend, in which a beam may be diffracted by the same or similar inclined gratings, may vary in one or more axes. As such, a degree, in which the curve deviates from the ideal sinusoidal wave curve, or from a sinusoidal wave curve obtained from a reference overlay value, may be determined so as to qualitatively monitor the influence on the process.

In the foregoing example embodiments, an overlay mark and a measurement method of obtaining bias values in all of the x and y directions are described. In some example embodiments, an overlay mark and a measurement method of obtaining a bias value in a single direction may be provided, and the overlay mark may be changed in various forms.

FIGS. 8 through 10B are various examples of overlay marks employable according to some example embodiments of the present inventive concepts. In order to describe various combinations of overlapping grating structures, gratings, disposed on first and second levels, may be briefly illustrated as a diagonal dotted line and a solid line.

Figure 8:
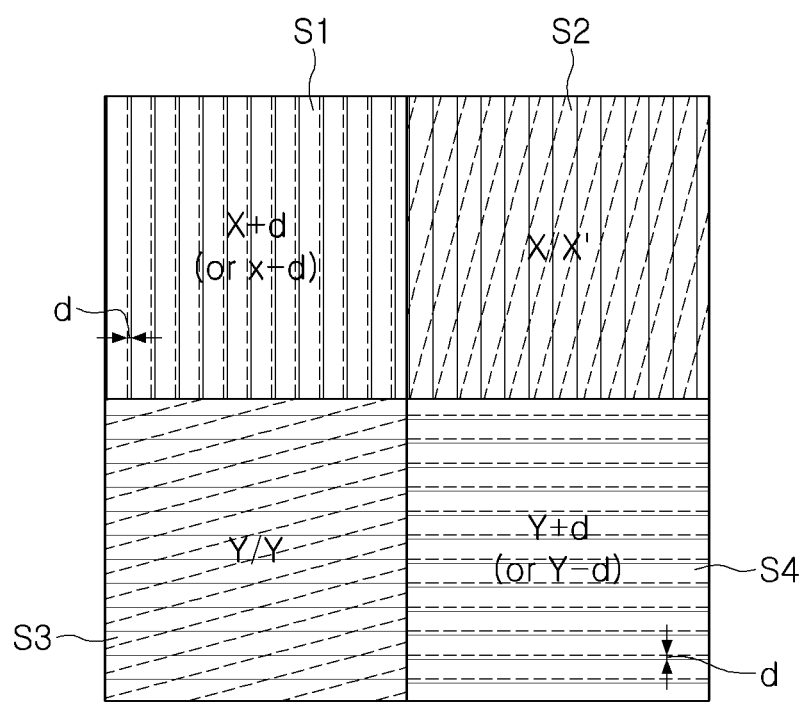
FIG. 8, FIG. 9, FIG. 10A, and FIG. 10B are various examples of overlay marks employable according to some example embodiments.

Referring to FIG. 8, similarly to the overlay mark 10 illustrated in FIG. 1, an overlay mark may be illustrated as having four cells S1 to S4 arranged in a 2×2 matrix.

Unlike in the overlay mark 10 illustrated in FIG. 1, an overlapping grating structure X+d, arranged in parallel in an x direction, and an overlapping grating structure Y+d, arranged in parallel in a y direction, may be disposed in one diagonal direction. Similarly, an overlapping grating structure X/X', inclined in the x direction, and an overlapping grating structure Y/Y', inclined in the y direction, may be disposed in the other diagonal direction.

Further, each of the overlapping grating structures X+d and Y+d, disposed in parallel, may have a preset bias value, for example, a negative bias value −d, other than a positive bias value +d, and the preset bias value may also vary.

Figure 9:
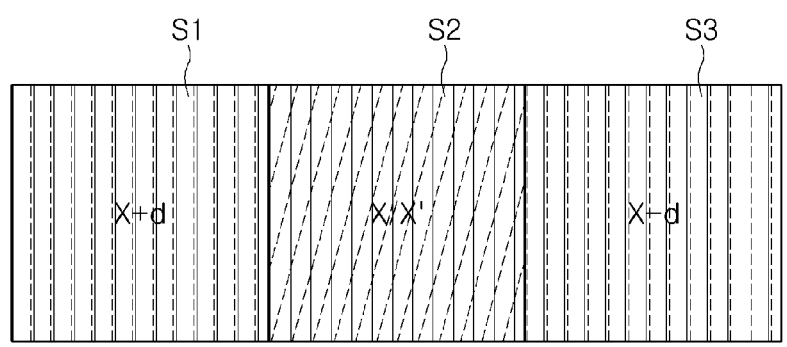

Referring to FIG. 9, an overlay mark may be illustrated as having three cells S1 to S3 arranged in a row.

Overlapping grating structures X+d and X−d may be disposed in parallel in an x direction on both sides of the overlay mark, and overlapping grating structure X/X' may also be inclined in the x direction between the overlapping grating structures X+d and X−d. In some example embodiments, in addition to a measurement method according to some example embodiments, an overlay error may be measured using the overlapping grating structures X+d and X−d, arranged in parallel in the x direction, and a conventional measurement method (using cells having positive and negative bias values).

An overlay mark, according to some example embodiments, may also be changed to an overlay mark for obtaining a bias value in the y direction. Further, the overlay mark may be implemented as an M×N or M×M matrix, in which M and N are positive integers greater than or equal to 2.

Figure 10A:
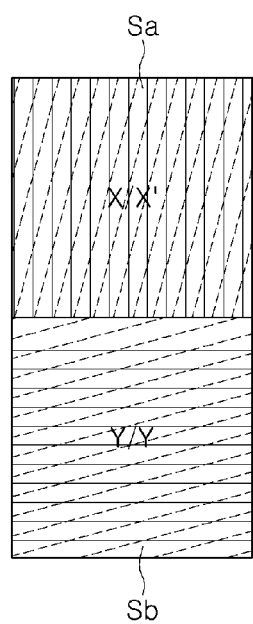
Figure 10B:
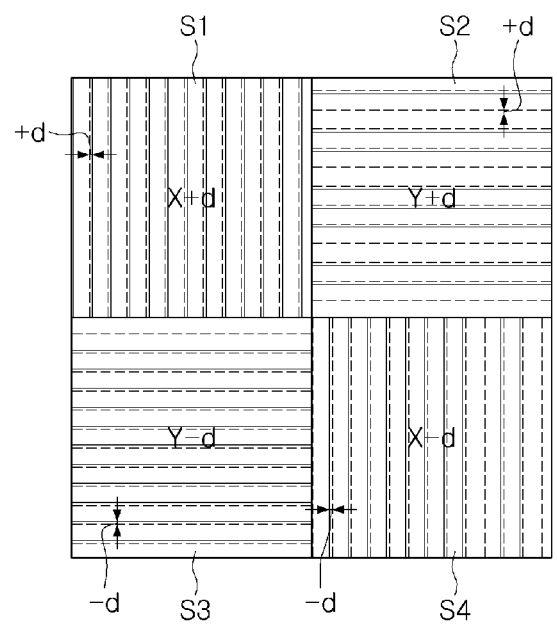

Referring to FIGS. 10A and 10B, an overlay mark (a) having a diagonal pattern, and an overlay mark (b) having a 4×4 matrix similar to a conventional overlay mark may be illustrated. The overlay mark (a) having a diagonal pattern may include overlapping grating structures Sa and Sb, inclined in x and y directions, and the overlay mark (b) may include four cells S1 to S4 that may include overlapping grating structures X+d and X−d, arranged in parallel in the x direction, and overlapping grating structures Y+d and Y−d, arranged in parallel in the y direction. In some example embodiments, the two overlay marks (a) and (b) may be disposed in different regions, respectively.

Along an SL region, as illustrated in FIGS. 10A-10B, the overlay mark (a) having a diagonal pattern may be separated from other overlay marks, but may be arranged adjacent to other overlay marks (for example, the overlay marks of FIGS. 1, 8, and 10A-10B) to thus reduce a deviation between cells according to an influence on the process and on measurement conditions in a process of measuring the intensity of a diffracted beam.

The arrangement of inclined gratings may be designed such that one or more periods (three or more points on which the intensity of a diffracted beam is zero) of changes in the intensity of a diffracted beam may be formed. In particular, in order to form an accurate curve of a diffracted beam, two or more points (also referred to as "zero points"), at which the intensity of the diffracted beam is zero, may need to be secured. When the length of an inclined grating is insufficient due to space constraints or the like, a bias value may not be changed within a sufficient range thereof. As a result, zero points in the intensity of a diffracted beam may be less than or equal to 2. In this case, using a linear or sine approximation method, a measured curve may be extended as a pseudo-sinusoidal wave curve such that two or more zero points may be secured in the measured curved.

Figure 11:
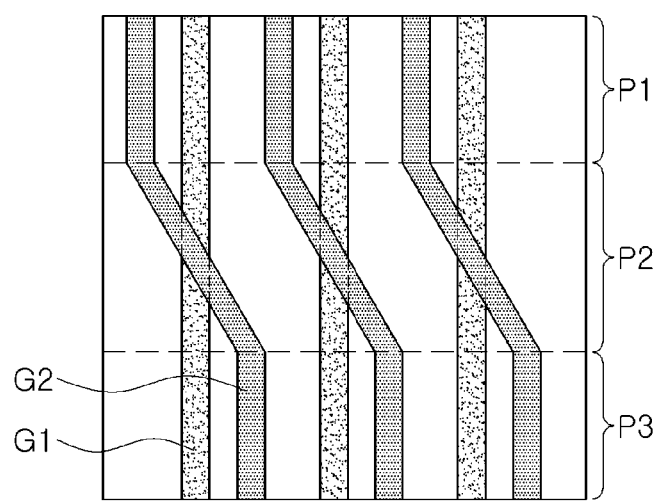
FIG. 11 is a schematic plan view of an example of an overlay mark.
Figure 12:
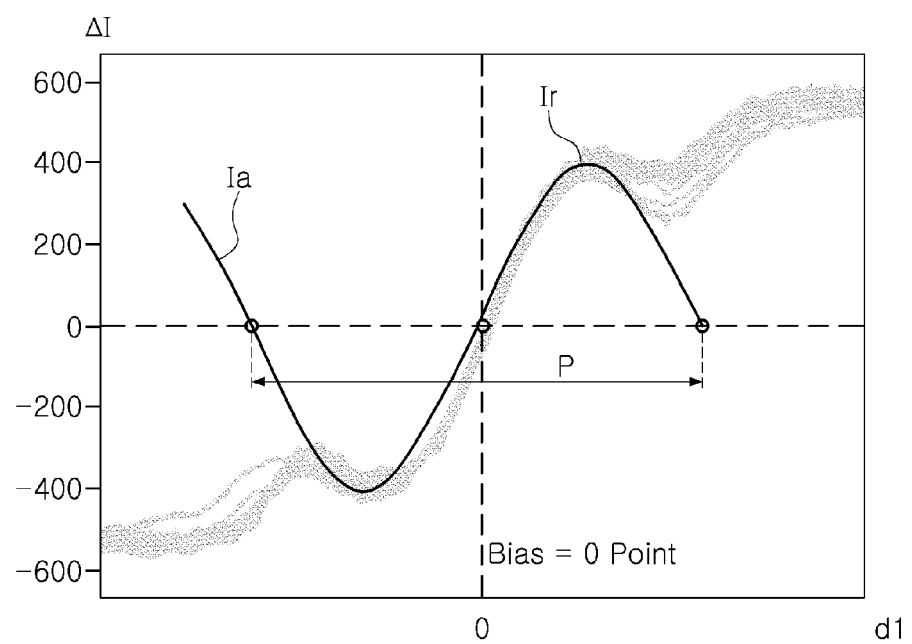
FIG. 12 is a graph illustrating a result in which sine approximation of the intensity of a diffracted beam measured from the overlay mark illustrated in FIG. 11 is performed.

Referring to FIG. 11, each of a first grating G1 and a second gratings G2 forming an overlay mark may have a linear pattern in an upper region P1 and a lower region P3, and the second grating G2 may have a diagonal pattern, for example, an inclined pattern, in a central region P2. In this case, when the length of the inclined second grating G2 is insufficient, as illustrated in FIG. 12, a curve Ir indicating the actually measured intensity of a diffracted beam may have only one zero point (e.g., a point associated with a null intensity of the diffracted beam). However, the curve Ir may be extended as a pseudo-sinusoidal wave curve Ia by using a sine approximation method such that three zero points may be secured in the curve Ir.

Figure 14:
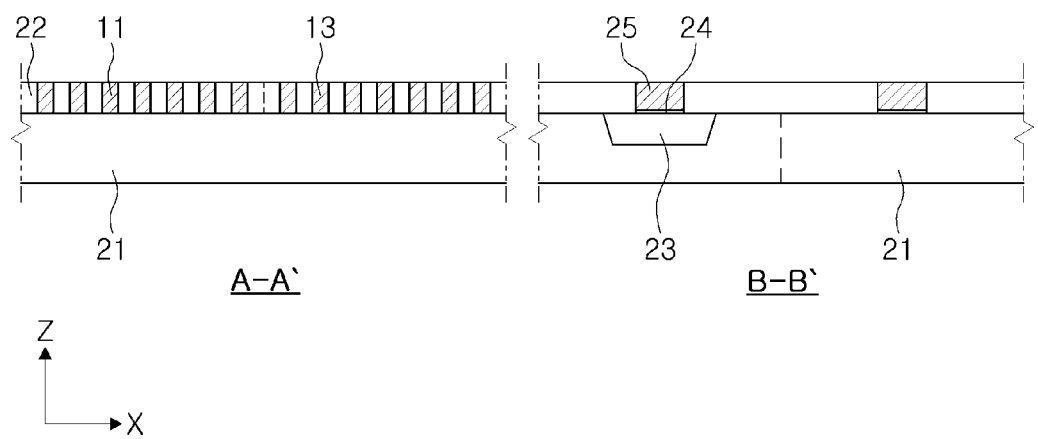
Figure 15:
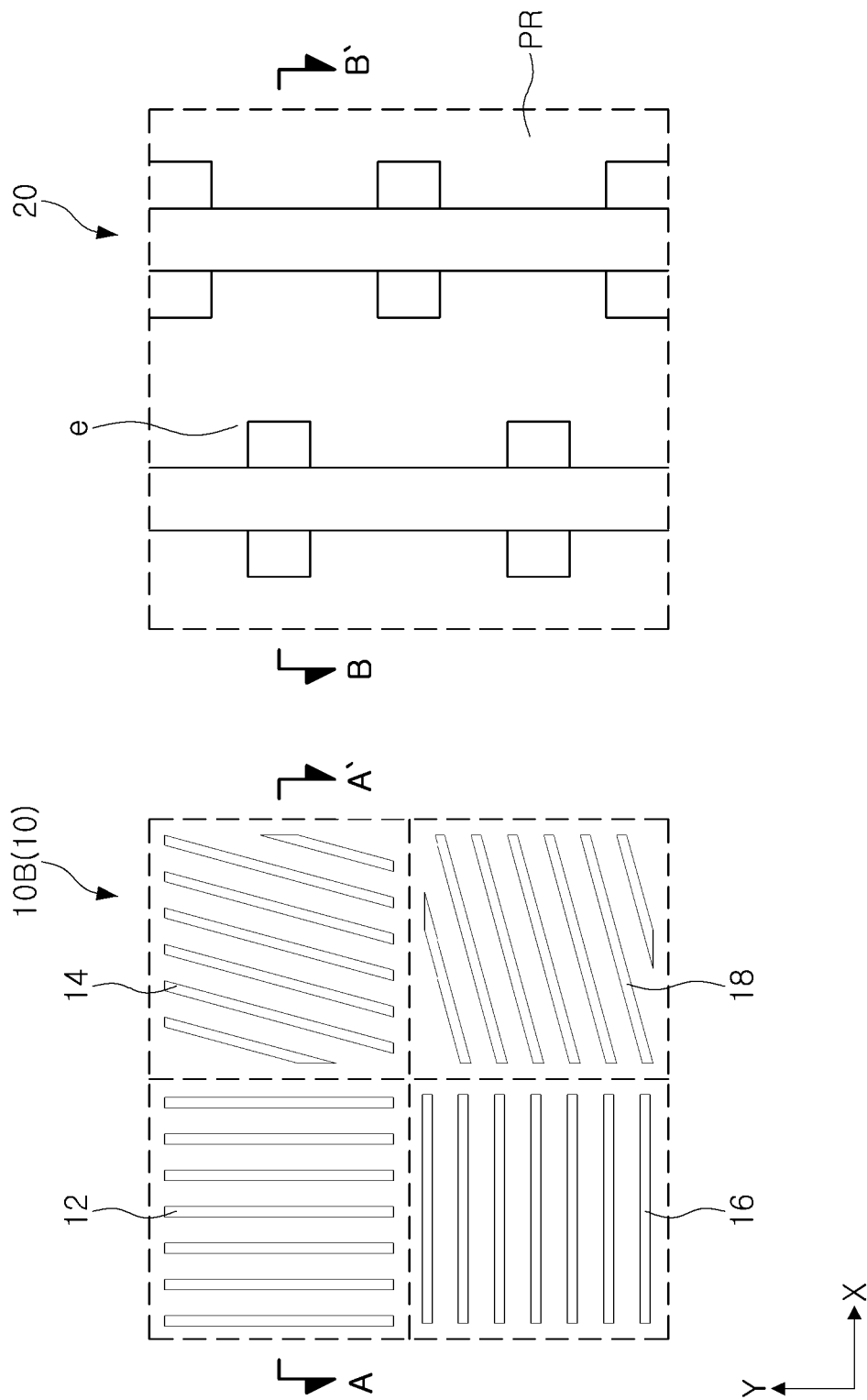
Figure 16:
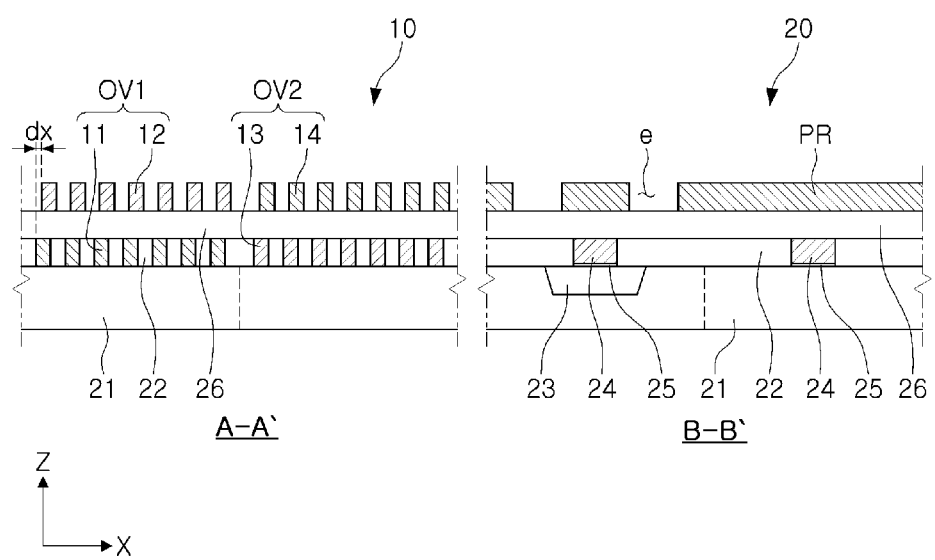

FIGS. 13 through 17 are views illustrating a method of manufacturing a semiconductor device according to some example embodiments of the present inventive concepts. FIGS. 14 and 16 are cross-sectional views of FIGS. 13 and 15, respectively.

Referring to FIGS. 13 and 14, a semiconductor substrate 21 may include a region for forming a first overlay mark 10A and a region for forming a transistor 20. The transistor 20 may be exemplified, and may, however, be replaced by various types of patterning devices forming a semiconductor chip. An overlay mark 10 may be disposed on SL surrounding a semiconductor chip region.

The transistor 20 may include the semiconductor substrate 21, an active region 23, a gate insulating layer 24, a gate electrode 25, and a first interlayer insulating layer 22. The active region 23 may be formed in the semiconductor substrate 21, and may also have a device separator formed therein. The semiconductor substrate 21 may have the gate insulating layer 24 and the gate electrode 25 formed thereon. The gate electrode 25 may have the first interlayer insulating layer 22 formed therearound.

The semiconductor substrate 21 may have the first overlay mark 10A disposed thereon. The first overlay mark 10A may be formed along with the gate electrode 25. Respective first, third, fifth, and seventh gratings 11, 13, 15, and 17 may be formed by forming a plurality of trenches in SL along with a trench for the gate electrode 25 in the first interlayer insulating layer 22, and filling the formed trenches with the same material.

The first overlay mark 10A may include the first and third gratings 11 and 13, arranged in an x direction, and the fifth and seventh gratings 15 and 17, arranged in a y direction, as illustrated in FIGS. 1 and 2A. A detailed description of the first overlay mark 10A may be provided with reference to FIGS. 1 and 2A.

Figure 17:
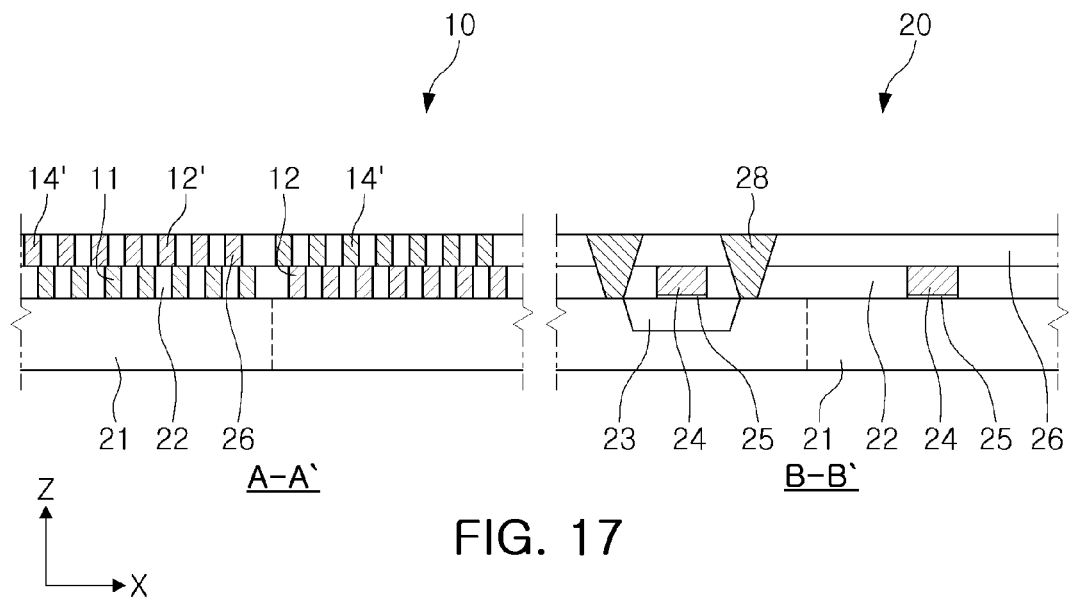

Referring to FIGS. 15 and 16, a second interlayer insulating layer 26 may be formed on the first interlayer insulating layer 22, and then, a photoresist pattern PR having an opening e for formation of a contact plug 28 of FIG. 17 may be formed on the second interlayer insulating layer 26. In such a lithography process, a process of forming a second overlay mark 10B along with a process of forming the photoresist pattern PR may be performed in an SL region on the second interlayer insulating layer 26.

In the present process, use of the overlay mark 10 may allow an overlay error to be measured, as described above, and the overlay mark 10 may include the first overlay mark 10A including a gate electrode 25 material and the second overlay mark 10B including the photoresist pattern PR.

In detail, an overlay error may be measured by measuring a bias difference between the pattern formed in the previous process and the pattern formed in the present process by using a diffracted beam. According to the overlay error measurement result, when the overlay error is "spec-in", a follow-up process, including incorporating the overlay mark 10 into an electronic device, may proceed, and when the overlay error is "spec-out", the photoresist pattern PR may be removed, and/or a compensation value for a misalignment of the pattern may be calculated, and the overlay error may be compensated in the follow-up process.

Next, as illustrated in FIG. 17, the contact plug 28 may be formed to the active region 23 through the first interlayer insulating layer 22 and the second interlayer insulating layer 26 by using the photoresist pattern PR.

In such a contact plug formation process, patterns 12' and 14' may be formed by forming trenches through selective etching of the second interlayer insulating layer 26 by using second and fourth gratings 12 and 14 and filling the formed trenches with the same material as the contact plug 28. If necessary, such a filling pattern may also be utilized as an overlay mark for a follow-up process.

As set forth above, according to example embodiments of the present inventive concepts, changes in the intensity of a diffracted beam according to a bias value (or a trend, in which a beam may be diffracted according to changes in the bias value) may be produced more accurately by arranging at least one of two overlapping gratings, that may form a target overlay, to be inclined, and the intensity of the diffracted beam may be accurately converted into an overlay error, using the produced change in the intensity of the diffracted beam. Further, using information on changes in the intensity of a diffracted beam according to a bias value, influence on the process, or the like, may be monitored.

Figure 18:
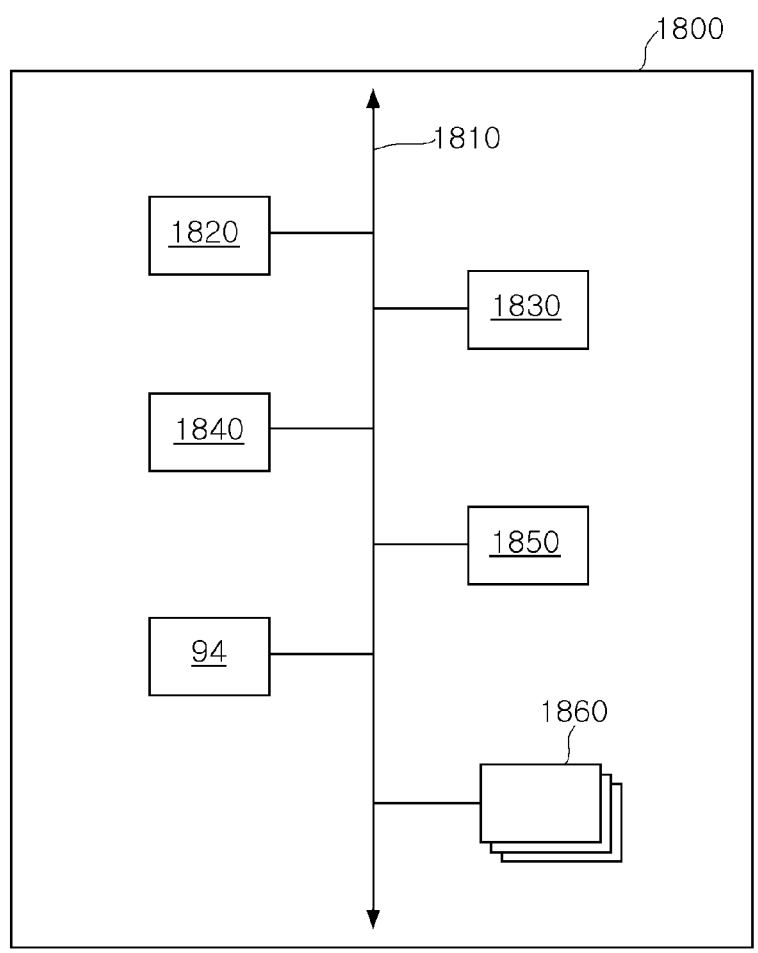
FIG. 18 is a diagram illustrating an electronic device according to some example embodiments.

FIG. 18 is a diagram illustrating an electronic device 1800 according to some example embodiments. In some example embodiments, the electronic device 1800 is configured to perform some or all of the operations described herein, including the operations described and illustrated with regard to at least FIGS. 4-17.

Referring to FIG. 18, the electronic device 1800 includes a memory 1820, a processor 1830, a device 1840, and a communication interface 1850. The device 1840 may include one or more devices configured to form one or more overlays, including one or more overlay marks, including the example embodiments of overlay marks 10A and 10B illustrated and described with regard to FIGS. 1-2B, including one or more devices configured to form one or more overlay marks via the operations illustrated in FIGS. 13-17. The device 1840 may include one or more devices configured to form one or more devices, including one or more semiconductor devices, that incorporate one or more overlay marks, e.g., perform operation (S180) in FIG. 4.

The electronic device 1800 may be included in one or more various electronic devices. In some example embodiments, the electronic device 1800 may include a computing device. A computing device may include a personal computer (PC), a tablet computer, a laptop computer, a netbook, some combination thereof, or the like. The memory 1820, the processor 1830, the device 1840, the scatterometer 94, the one or more light sources 1860, and the communication interface 1850 may communicate with one another through a bus 1810.

The communication interface 1850 may communicate data from an external device using various Internet protocols. For example, the communication interface 1850 may communicate data generated by the scatterometer 94 to an external device. The external device may include, for example, a computing device.

The processor 1830 may execute a program and control the electronic device 1800. A program code to be executed by the processor 1830 may be stored in the memory 1820. An electronic system may be connected to an external device through an input/output device (not shown) and exchange data with the external device.

The memory 1820 may store information output from the device 1840, scatterometer 94, etc. The memory 1820 may be a volatile or a nonvolatile memory. The memory 1820 may be a non-transitory computer readable storage medium. The memory may store computer-readable instructions that, when executed, cause the execution of one or more methods, functions, processes, etc. as described herein. In some example embodiments, the processor 1830 may execute one or more of the computer-readable instructions stored at the memory 1820.

In some example embodiments, the electronic device 1800 may include one or more light sources 1860 that may generate one or more beams to perform one or more of the operations as described with reference to at least FIG. 4, FIGS. 5A-5B, FIGS. 6A-6D, and FIG. 7. For example, the one or more light sources 1860 may include a first light source that may emit a first light beam B(+) and a second light beam B(−) to be incident to one or more overlay marks.

In some example embodiments, the communication interface 1850 may include a USB and/or HDMI interface. In some example embodiments, the communication interface 1850 may include a wireless communication interface.

While example embodiments have been shown and described above, it will be apparent to those skilled in the art that modifications and variations could be made without departing from the scope of the present inventive concepts as defined by the appended claims.

What is claimed is:

1. A method, comprising:
   forming a first overlay mark having a first grating and a third grating on a first level, the first grating and the third grating periodically arranged in a first direction;
   forming a second overlay mark having a second grating and a fourth grating, periodically arranged in a second direction on a second level different from the first level, such that
      the first grating and the second grating are substantially parallel to each other in a region of vertical overlap of the first grating and the second grating, and
      the third grating and the fourth grating are tilted with respect to each other in a region of vertical overlap of the third grating and the fourth grating;
   directing a beam to be incident to the first overlay mark and the second overlay mark;
   measuring an intensity of a first diffracted beam from the first grating and the second grating, based on the directed beam being incident to the first overlay mark;
   generating trend information associated with a second diffracted beam based on measuring an intensity of the second diffracted beam from the third grating and the fourth grating along a length direction of the third grating, based on the directed beam being incident to the second overlay mark, wherein the trend information indicates a relationship between the intensity of a diffracted beam and a bias value;
   determining an overlay error based on the measured intensity of the first diffracted beam and the generated trend information associated with the second diffracted beam; and
   selectively incorporating at least the second overlay mark into a semiconductor device, based on whether the overlay error at least meets a threshold error value, the selectively incorporating including performing one of,
      re-processing at least the second overlay mark, based on a determination that the overlay error at least meets the threshold error value, or
      forming the semiconductor device, using at least the second overlay mark, based on a determination that the overlay error is less than the threshold error value.

2. The method of claim 1, wherein the measuring of the intensity of the first diffracted beam includes,
   measuring an intensity of a positive first-order diffracted beam from the first grating and the second grating, based on directing a first beam incident in a first horizontal direction;
   measuring an intensity of a negative first-order diffracted beam from the first grating and the second grating, based on directing a second beam incident in a second horizontal direction opposite to the first horizontal direction; and
   calculating the intensity of the first diffracted beam based on a difference between the intensity of the positive first-order diffracted beam and the intensity of the negative first-order diffracted beam.

3. The method of claim 1, wherein generating the trend information includes,
   measuring an intensity of a positive first-order diffracted beam from the third grating and the fourth grating, in the length direction of the third grating, based on directing a first beam incident in a first horizontal direction;
   measuring an intensity of a negative first-order diffracted beam from the third grating and the fourth grating, along the length direction of the third grating, based on directing a second beam incident in a second horizontal direction opposite to the first horizontal direction; and
   calculating the relationship between the intensity of a diffracted beam and the bias value based on determining a variation, along the length direction of the third grating, of a difference between the intensity of the positive first-order diffracted beam and the intensity of the negative first-order diffracted beam.

4. The method of claim 1, wherein the trend information associated with the diffracted beam is represented by a sinusoidal wave curve in a coordinate system having the length direction of the third grating defined as an x axis and having the intensity of the second diffracted beam defined as a y axis.

5. The method of claim 4, wherein the sinusoidal wave curve includes at least two points, on which the intensity of the second diffracted beam is zero, in the length direction of the third grating.

6. The method of claim 1, wherein the second grating is biased from the first grating in the first direction.

7. The method of claim 1, wherein,
   the first overlay mark further includes a fifth grating and a seventh grating on the first level, the fifth grating and the seventh grating periodically arranged in a direction perpendicular to the first direction, and the second overlay mark further includes
- a sixth grating arranged substantially in parallel to the fifth grating in a region of vertical overlap of the fifth grating and the sixth grating on the second level, and
- an eighth grating tilted with respect to the seventh grating in a region of vertical overlap of the seventh grating and the eighth grating on the second level.

8. The method of claim 1, wherein,
the first overlay mark further includes a fifth grating periodically arranged in the first direction on the first level;
the second overlay mark further includes a sixth grating arranged substantially in parallel to the fifth grating in a region of vertical overlap of the fifth and sixth gratings on the second level;
the second grating is biased from the first grating in the first direction by a first distance; and
the sixth grating is biased from the fifth grating in a direction opposite to the first direction by the first distance.

9. The method of claim 8, wherein,
the third grating is between the first grating and the fifth grating, and
the fourth grating is between the second grating and the sixth grating.

10. The method of claim 1, wherein,
the first grating and the third grating are adjacent to each other on the first level, and
the second grating and the fourth grating are adjacent to each other on the second level.

11. The method of claim 1, wherein the first level is below the second level.

12. A method, comprising:
forming a first grating and a second grating on different levels according to at least one lithography process, such that
   the second grating at least partially vertically overlaps with the first grating,
   the first grating and the second grating have a substantially common pitch, and
   the first grating and the second grating are inclined with respect to each other, such that a bias value that indicates a bias between the first grating and the second grating varies along a length direction of the first and second gratings;
directing a directed beam to the first and second gratings;
generating trend information associated with a diffracted beam based on an image pattern of a beam, diffracted by the first grating and the second grating, using the directed beam, wherein the trend information indicates a relationship between an intensity of the diffracted beam and the bias value; and
selectively incorporating at least the second grating into a semiconductor device, based on whether an overlay error at least meets a threshold error value, the selectively incorporating including performing one of,
   re-processing at least the second grating, based on a determination that the overlay error at least meets the threshold error value, or
   forming the semiconductor device, using at least the second grating, based on a determination that the overlay error is less than the threshold error value.

13. The method of claim 12, further comprising:
determining a difference between a pseudo-sinusoidal wave curve and an ideal sinusoidal wave curve, wherein the pseudo-sinusoidal wave curve represents the trend information associated with the diffracted beam.

14. The method of claim 12, further comprising:
extending a curve as a sinusoidal wave curve through sine approximation, the curve being a representation of the trend information associated with the diffracted beam, the curve having less than two points associated with a null intensity of the diffracted beam that, such that the extended curve has two or more points associated with the null intensity of the diffracted beam.

15. The method of claim 12, wherein the trend information associated with the diffracted beam is represented by a sinusoidal wave curve on at least one cycle.

16. A method, comprising:
directing a first beam and a second beam to be incident to a first overlay mark and a second overlay mark, the first overlay mark including a first grating and a third grating periodically arranged in a first direction on a first level, the second overlay mark including a second grating and a fourth grating, periodically arranged in a second direction on a second level different from the first level, the first grating and the second grating being substantially parallel to each other in a region of vertical overlap of the first grating and the second grating, the third grating and the fourth grating being tilted with respect to each other in a region of vertical overlap of the third grating and the fourth grating, the first beam and the second beam being incident in opposite horizontal directions;
measuring an intensity of a first diffracted beam from the first grating and the second grating, based on the first beam and the second beam incident to the first overlay mark;
measuring an intensity of a second diffracted beam from the third grating and the fourth grating at a plurality of locations along a length direction of the third grating, based on the first beam and the second beam incident to the second overlay mark;
determining a relationship between an intensity of a diffracted beam and a bias value, based on a variation of the measured intensity of the second diffracted beam along the length direction of the third grating;
determining an overlay error based on the measured intensity of the first diffracted beam and the determined relationship; and
selectively incorporating at least the second overlay mark into a semiconductor device, based on whether the overlay error at least meets a threshold error value, the selectively incorporating including performing one of,
   re-processing at least the second overlay mark, based on a determination that the overlay error at least meets the threshold error value, or
   forming the semiconductor device, using at least the second overlay mark, based on a determination that the overlay error is less than the threshold error value.

17. The method of claim 16, further comprising:
prior to directing the first beam and the second beam to be incident to the first overlay mark and the second overlay mark, forming the first overlay mark and the second overlay mark.

18. The method of claim 16, wherein the measuring of the intensity of the first diffracted beam includes, measuring an intensity of a positive first-order diffracted beam from the first grating and the second grating, based on directing the first beam incident in a first horizontal direction;

measuring an intensity of a negative first-order diffracted beam from the first grating and the second grating, based on directing the second beam incident in a second horizontal direction opposite to the first horizontal direction; and calculating the intensity of the first diffracted beam based on a difference between the intensity of the positive first-order diffracted beam and the intensity of the negative first-order diffracted beam.

19. The method of claim 16, wherein the measuring of the intensity of the second diffracted beam includes, measuring an intensity of a positive first-order diffracted beam from the third grating and the fourth grating, in the length direction of the third grating, based on directing the first beam incident in a first horizontal direction; and measuring an intensity of a negative first-order diffracted beam from the third grating and the fourth grating, along the length direction of the third grating, based on directing a second beam incident in a second horizontal direction opposite to the first horizontal direction; and calculating the intensity of the second diffracted beam based on a difference between the intensity of the positive first-order diffracted beam and the intensity of the negative first-order diffracted beam.

20. The method of claim 16, wherein the first beam and the second beam are included in a common beam directed to the first overlay mark and the second overlay mark.

* * * * *

UNITED STATES PATENT AND TRADEMARK OFFICE
CERTIFICATE OF CORRECTION

PATENT NO. : 9,846,359 B1
APPLICATION NO. : 15/392297
DATED : December 19, 2017
INVENTOR(S) : Seung Hwa Oh et al.

It is certified that error appears in the above-identified patent and that said Letters Patent is hereby corrected as shown below:

On the Title Page

(65) PRIOR PUBLICATION DATA should read:
US-2017-0357154-A1 Dec. 14, 2017

Signed and Sealed this
Twenty-seventh Day of February, 2018

Andrei Iancu
*Director of the United States Patent and Trademark Office*